Oct. 6, 1970 S. I. HECHT 3,533,020

REDUCTION OF INTERMODULATION IN VARACTOR-TUNED FILTERS

Filed Jan. 13, 1969

INVENTOR.
SOLOMON I. HECHT
BY Harry A. Herbert, Jr.
George Fine
ATTORNEYS

United States Patent Office
3,533,020
Patented Oct. 6, 1970

3,533,020
REDUCTION OF INTERMODULATION IN VARACTOR-TUNED FILTERS

Solomon I. Hecht, Hauppauge, N.Y., assignor to the United States of America as represented by the Secretary of the Air Force Filed Jan. 13, 1969, Ser. No. 790,713
Int. Cl. H03h 7/10, 7/14
U.S. Cl. 333—17 3 Claims

ABSTRACT OF THE DISCLOSURE

An apparatus for the reduction of intermodulation in varactor tuned filters utilizing a pair of opposingly biased varactors which are connected in parallel to reduce even order intermodulation without degrading the tuning capabilities of the circuit.

BACKGROUND OF THE INVENTION

The use in prior art electronically tunable filters of active filter elements, such as varactors for tuning elements, introduces intermodulation products into the filter circuits. The varactors, due to their nonlinear characteristics inherently produce second and higher order harmonics of the input signal. Third order harmonics are also generated but their amplitudes are substantially lower than the second order harmonics. The present invention provides a circuit which essentially eliminates the second order harmonics due to the nonlinear characteristics of the varactors and substantially lowers third order harmonics over prior art filter circuits which utilize varactors for tuning elements.

SUMMARY OF THE INVENTION

The present invention which is utilized in a straightforward inductively coupled double tuned circuit having transformers to provide the required impedance levels to the resonator circuits, is a varactor-tuned filter circuit. The varactor-tuned filter circuit is so arranged as to utilize two opposingly biased varactors which are connected in a parallel circuit configuration to cancel even order harmonic intermodulation generated by the individual varactor devices. The arrangement of the varactor devices in this opposing configuration effectively cancels all generated even harmonics of the applied signal and, as a result, the second harmonic is entirely eliminated. A by-product of the present invention is the substantial reduction in third order intermodulation products.

It is one object of the invention, therefore, to provide an improved varactor-tuned filter circuit having a substantial reduction in even order intermodulation products which are due to the nonlinear characters of varactors.

It is another object of the invention to provide an improved varactor-tuned filter circuit having a parallel circuit of opposingly biased varactor pair in a tuned filter environment.

It is another object of the invention to provide an improved varactor-tuned filter circuit utilizing the nonlinear characteristics of varactors in a novel circuit configuration to produce cancellation of second order intermodulation products.

These and other advantages, objects and features of the invention will become more apparent from the following detailed description when taken in conjunction with the illustrative embodiments in the accompanying drawings, wherein:

DESCRIPTION OF THE PREFERRED EMBODIMENT

Figure 1:
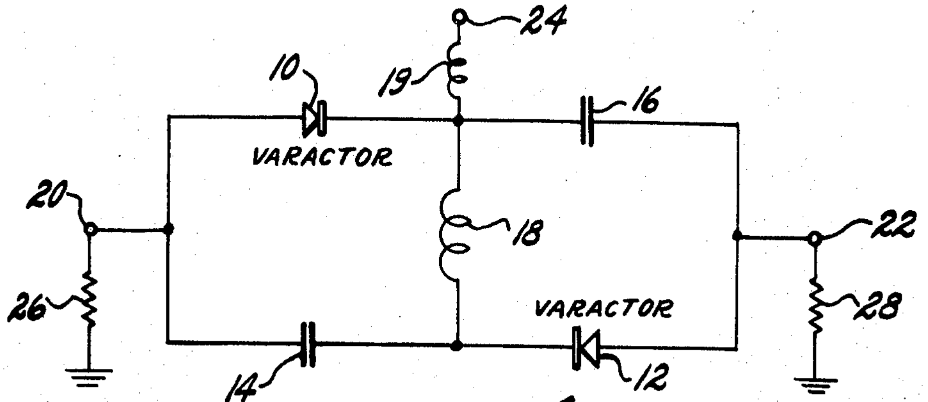
FIG. 1 is a schematic diagram of the preferred embodiment of this invention utilizing a pair of opposingly biased varactors connected in a parallel circuit configuration.

Referring now to FIG. 1, the varactor intermodulation-reduction apparatus is comprised of a pair of opposingly biased varactors 10, 12 which are arranged in a parallel circuit configuration. The input signal is applied to the varactor intermodulation-reduction apparatus (hereinafter referred to as varactor network) at input terminal 20. Input terminal 20 is connected to the anode of varactor 10 and to one end of capacitor 14. The cathode of varactor 10 is connected to the lower end of R-F choke 19, top end of R-F choke 18 and one end of capacitor 16. The power supply terminal 24 is connected to the top end of R-F choke 19. The other end of capacitor 14 is connected to the bottom end of R-F choke 18 and the cathode of varactor 12. The other end of capacitor 16 and the anode of varactor 12 are both connected to output terminal 22.

It may be seen that an input signal which is applied at terminal 20 has two equal parallel signal paths to output terminal 22. The first signal path is through the series combination of varactor 10 and capacitor 16 and the second signal path is through the series combination of capacitor 14 and varactor 12.

The power supply voltage that is applied at terminal 24 is the control voltage which is used to establish the capacitance of varactors 10, 12. The control voltage at terminal 24 is applied to varactor 10 through R-F choke 19 and to varactor 12 through R-F choke 18. R-F choke 19 prevents the input signal from entering the power supply and R-F choke 18 isolates the signal in varactor 10 from the signal in varactor 12. The two signal paths are parallel and substantially equal.

The ground return path for the control voltage supplied to varactor 12 is provided by the external output impedance 28 connected between output terminal 22 and ground. The ground return path from the control voltage supplied to varactor 10 is provided by the external input impedance 26 connected between input terminal 20 and ground.

The above configuration results in a composite capacitance versus signal voltage characteristic that is an even function. It may be shown that the current through the varactors 10, 12 contains only odd harmonics of the signal frequency.

For a nonliner device, the intermodulation products (hereinafter referred to as IM) occur at frequencies given by $$f_{mn} = mf_1 \pm nf_2 \quad (1)$$

where $f_{mn}$ = intermodulation frequencies
$f_1$ = frequency of the first input signal
$f_2$ = frequency of the second input signal
$m, n, = 0, 1, 2 \ldots$ The associated power levels are given by $$P_{mn} = mP_1 + nP_2 + K_{mn} \quad (2)$$

where $P_{mn}$ = intermodulation product level in dbm.
$P_1$ = level of the first input signal referred to the output of the device in dbm.
$P_2$ = level of the second input siganl referred to the output of the device in dbm.
$K_{mn}$=constant, depending on the device, in dbm.

Of particular importance are products which occur within the passband of the filter. Specifically investigated were a third-order IM product such that $$2f_1 - f_2 = f_o$$

and a second-order IM product (second harmonic)

$$2f_1 = f_o$$

where $f_o$ = center frequency of the filter

Theoretically, for identical varactors connected as shown in FIG. 1, the second harmonic should be entirely eliminated, since even harmonics are effectively cancelled and therefore cannot be generated. The third-order intermodulation level is reduced and its theoretical level can be obtained from Equation 2. For simplicity, with no loss of generality, we assume that $P_1 = P_2 = P$, and Equation 2 becomes $P_{21} = 3P + K_{21}$. For two substantially identical varactors, the incident power levels will split equally, resulting in a total third-order IM level ($P'_{21}$) given by $$P'_{21} = 3\ (P = 3\text{ db}) + K_{21} + 3\text{ db}$$

$$P'_{21} = 3P + K_{21} - 6\text{ db}$$

Thus, it may be seen that a 6-db reduction in third-order IM is obtained. It should be noted that the improvement in odd-order intermodulation is obtained by virtue of the reduction in the power level appearing at each varactor. By using a multiple-varactor array, greater reductions are possible. With integrated circuit techniques this method is quite feasible and has been successfully employed to reduce intermodulation products in mixers. With an array of 100 varactors a 40-db reduction of third-order IM is possible.

Figure 2:
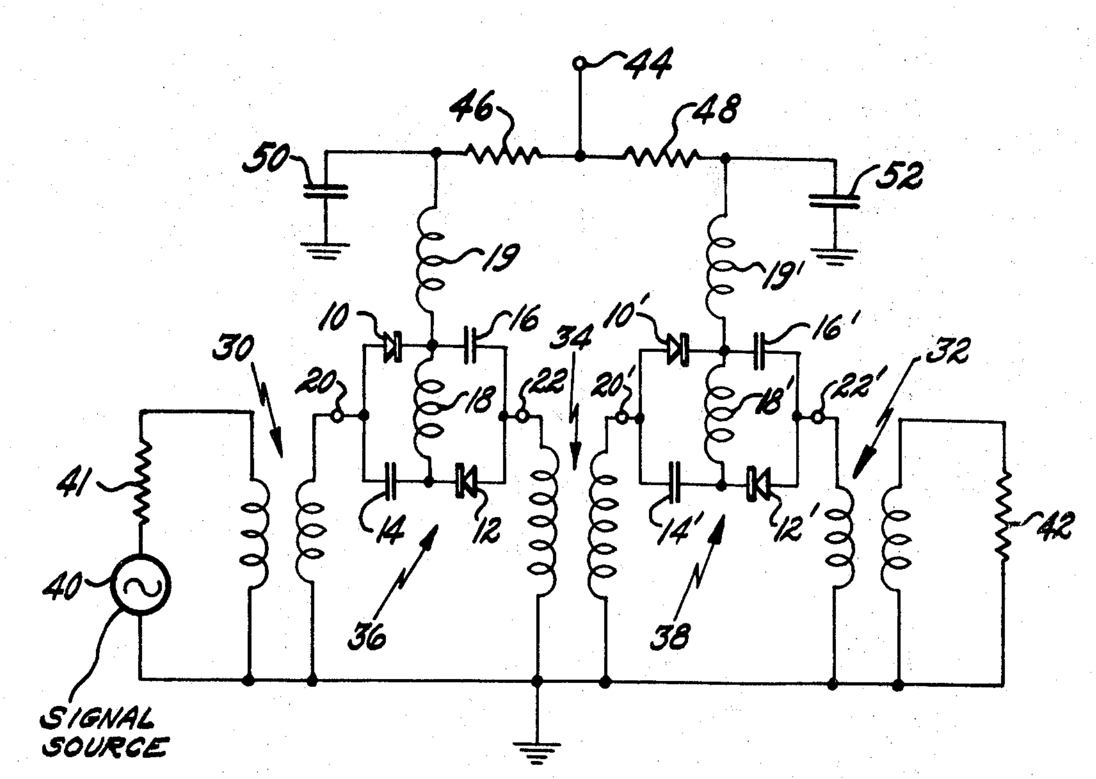
FIG. 2 is a schematic diagram of an inductively coupled double tuned filter circuit incorporating the preferred embodiment of FIG. 1.

The schematic diagram of a two pole electronically tunable filter which utilizes the present invention having opposingly biased varactors connected in parallel is shown in FIG. 2. The filter configuration is a straightforward inductively coupled double tuned circuit where transformers 30, 32 provide the required impedance levels to the resonators and transformer 34 determines the interresonator coupling. Signal source 40 applies a signal through resistor 41 to the primary winding of transformer 30. The secondary winding of transformer 30 couples the signal to the input terminal 20 of the varactor network 36. The varactor network 36 is identical with the circuit shown in FIG. 1 and the same numerals for the corresponding components are herein used. The operation of the varactor network 36 is as described in FIG. 1. The signal appearing at output terminal 22 is applied to the primary winding of transformer 34. The secondary winding of transformer 34 couples the signal appearing therein to the input of varactor network 38. Varactor network 38 is identical in operation and configuration to varactor network 36. The corresponding components of the two networks have been given a prime character in varactor network 38. The signal appearing at the output terminal 22' of varactor network 38 is coupled by transformer 32 to load resistor 42. The power supply voltage which is applied at terminal 44 supplies the control voltages which are required by varactor networks 36, 38 to control the capacitance of the varactors 10, 12, 10', 12'. Resistors 46, 48 respectively are current limiting resistors in the control voltage bias circuits for varactor networks 36, 38. Capacitors 50, 52 provide filtering for the control voltage bias circuits. The varactor networks 36, 38 are equivalent to variable capacitors. Theoretically, this network cannot generate even harmonics of the applied signal, since the varactors are biased in opposite directions and the even harmonics generated by the varactors are opposite in amplitude and cancel each other. Therefore, the filtered signal which appears at load resistor 42 is completely free of any second order harmonics.

Although the invention has been described with reference to a particular embodiment, it will be understood to those skilled in the art that the invention is capable of a variety of alternative embodiments within the spirit and scope of the appended claims.

I claim:

1. A varactor intermodulation-reduction apparatus for eliminating even order harmonic intermodulation comprising in combination:

(a) an input terminal;

(b) an output terminal;

(c) a control voltage input terminal;

(d) a first capacitor;

(e) a first varactor having a first and second electrode, said first electrode of said first varactor being connected to said input terminal and to one side of said first capacitor;

(f) a first RF choke, one side of said first RF choke being connected to said control voltage input terminal, the other side of said first RF choke being connected to said second electrode of said first varactor;

(g) a second RF choke, one side of said second RF choke being connected to said second electrode of said first varactor and said other side of said first RF choke, the other side of second RF choke being connected to the other side of said first capacitor;

(h) a second capacitor, one end of said second capacitor being connected to said second electrode of said first varactor, the other side of said first RF choke and said one side of said second RF choke;

(i) a second varactor having first and second electrodes similar to the respective first and second electrodes of said first varactor, said second electrode of said second varactor being connected to said other end of said first capacitor and to said other side of said second RF choke, said first electrode of said second varactor being connected to the other end of said second capacitor and to said output terminal;

(j) a first impedance coupled between said input terminal and ground;

(k) a second impedance coupled between said output terminal ground;

(l) means to apply an alternating current input to said input terminal;

(m) voltage means to apply a control voltage to said control voltage terminal, said control voltage providing the means to control the capacitance of said first and second varactors; and (n) means to derive an output signal from said output terminal.

2. A varactor intermodulation-reduction apparatus as described in claim 1 wherein said first impedance is the secondary winding of a transformer.

3. A varactor intermodulation-reduction apparatus as described in claim 1 wherein said second impedance is the primary winding of a transformer.

References Cited

UNITED STATES PATENTS

| | | | |
|---|---|---|---|
| 3,079,571 | 2/1963 | Elliott et al. | |
| 3,135,934 | 6/1964 | Schoenike | 307—320 X |
| 3,196,368 | 7/1965 | Potter | 307—320 X |
| 3,328,727 | 6/1967 | Lunk | 307—320 X |

PAUL L. GENSLER, Primary Examiner

U.S. Cl. X.R.

307—320; 333—70.77